United States Patent [19]
Arai et al.

[11] Patent Number: 5,789,779
[45] Date of Patent: Aug. 4, 1998

[54] IGFET CIRCUIT PREVENTING PARASITIC DIODE CURRENT

[75] Inventors: Takao Arai; Kazumi Yamaguchi, both of Tokyo, Japan

[73] Assignee: NEC Corporation, Tokyo, Japan

[21] Appl. No.: 871,984

[22] Filed: Jun. 10, 1997

Related U.S. Application Data

[63] Continuation of Ser. No. 553,759, Oct. 23, 1995, abandoned.

[30] Foreign Application Priority Data

Oct. 31, 1994 [JP] Japan .................................. 6-266888
Sep. 8, 1995 [JP] Japan .................................. 7-231716

[51] Int. Cl.[6] .................... H01L 29/76; H01L 23/62
[52] U.S. Cl. ................... 257/341; 257/335; 257/360
[58] Field of Search .................... 257/335, 341, 257/360

[56] References Cited

FOREIGN PATENT DOCUMENTS 4-171769  6/1992  Japan .

*Primary Examiner*—Valencia Wallace
*Attorney, Agent, or Firm*—Foley & Lardner

[57] ABSTRACT

The invention has the object of realizing a semiconductor device in which the various problems brought about by parasitic diodes in configuring a circuit are prevented, the semiconductor device being provided with first and second insulated-gate field-effect transistors, and being configured such that the source regions of the first and second insulation gate field-effect transistors are electrically connected, the back gate region, which in part constitutes a channel, and the source region of the first insulated-gate field-effect transistor are electrically connected, and the back gate region of the second insulated-gate field-effect transistor is electrically connected to the drain region of the first insulated-gate field-effect transistor.

12 Claims, 21 Drawing Sheets

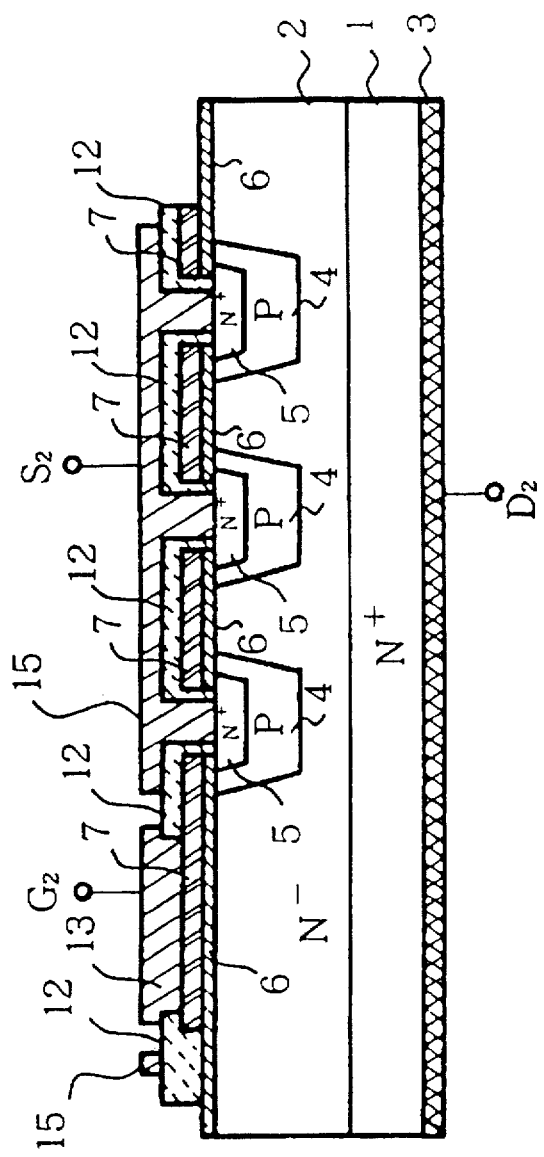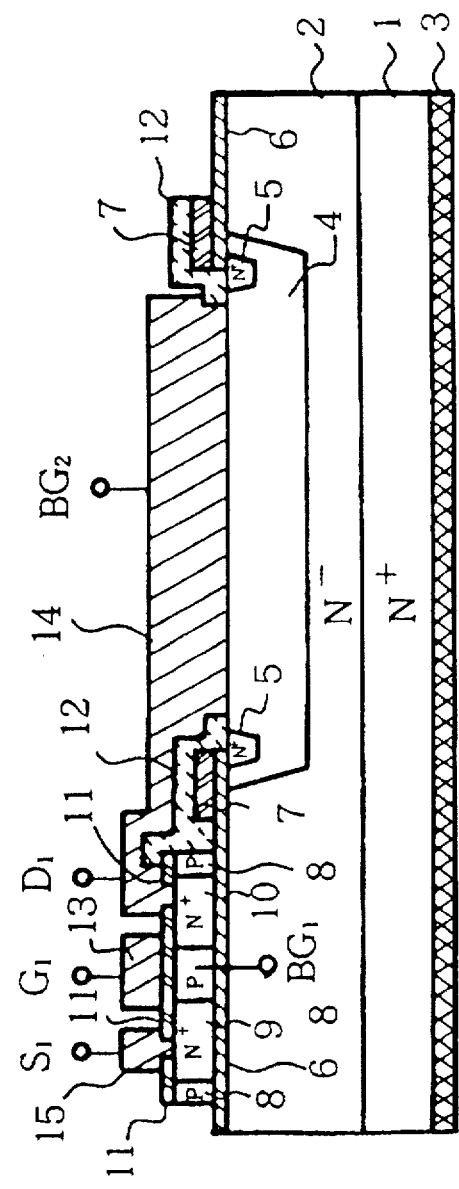
Fig. 10 (b)
Fig. 10 (c)

IGFET CIRCUIT PREVENTING PARASITIC DIODE CURRENT

This application is a continuation of application Ser. No. 08/553,759, filed Oct. 23, 1995 now abandoned.

BACKGROUND OF THE INVENTION

1. Field of the Invention

The present invention relates to a semiconductor device, and particularly to an insulated-gate field-effect transistor having excellent applicability as a switching regulator.

2. Description of the Related Art

FIGS. 1(a) and 1(b) are a sectional view and an equivalent circuit diagram, respectively, of a first example of a metal oxide semiconductor insulated-gate field-effect transistor (hereinafter referred to as a MOSFET) according to the prior art.

In FIG. 1(a), 16 is a high-density semiconductor substrate of $n^+$-type silicon, an $n^-$-type low-density epitaxial layer 17 being formed on one surface of this high-density semiconductor substrate 16, and a drain region being formed by the high-density semiconductor substrate 16 and the low-density epitaxial layer 17.

A drain electrode 18 is formed on the surface of the above-described high-density semiconductor substrate 16 opposite the surface on which the low-density epitaxial layer 17 is formed. In addition, p-type impurity diffusion regions 19 are formed as back gate regions within the above-described low-density epitaxial layer 17, and within these impurity diffusion areas 19 $n^+$-type impurity diffusion regions 20 are formed as source regions. Further, a gate electrode layer 22 is formed over this low-density epitaxial layer 17 overlying gate insulation film 21 that extends over a portion of the surfaces of the impurity diffusion regions 19, 20.

Interlayer insulation films 23 are formed over the above-described gate electrode layer 22, and a source electrode 24 is formed over this interlayer insulation film 23 such that source electrode 24, impurity diffusion regions 19 and impurity diffusion regions 20 are interconnected.

As shown in the equivalent circuit of FIG. 1(b), in a MOSFET constructed as described above, a parasitic diode 401 is parasitically formed with p-type impurity diffusion regions 19 corresponding to anodes and the $n^-$-type low-density epitaxial layer 17 corresponding to a cathode.

As will be described hereinbelow, the above-described parasitic diode has adverse effects in operation. A MOSFET that suppresses the effects of this parasitic diode is described in Japanese Patent Laid-open 171769/92 (the second example of the prior art), and FIGS. 2(a) and 2(b) show a sectional view and equivalent circuit, respectively, of this second example of the prior art.

In the second example of the prior art, high-density semiconductor substrate 127, low-density epitaxial layer 128, drain electrode 129, impurity diffusion regions 130, impurity diffusion regions 131, gate insulation film 132, gate electrode 133, interlayer insulation film 134, and source electrode 135 are equivalent to the high-density semiconductor substrate 16, low-density epitaxial layer 17, drain electrode 18, impurity diffusion regions 19, impurity diffusion regions 20, gate insulation film 21, gate electrode layer 22, interlayer insulation film 23, and source electrode 24, respectively, of the first example of the prior art shown in FIGS. 1(a) and 1(b), but this example differs from the first example in that source electrode 135 and low-density epitaxial layer 128 form a Schottky junction, and as shown in the equivalent circuit of FIG. 2(b), a Schottky barrier diode 137 is formed between the drain and source.

The problems arising in a circuit configured using a semiconductor device shown in the first example of the prior art in which the above-described parasitic diode is formed will next be explained.

FIG. 3 shows a bridge-type motor control circuit. As shown in this figure, the direction and speed of rotation of the motor can be controlled through ON/OFF control of the four MOSFETs $Q_{S1}$, $Q_{S2}$, $Q_{S3}$ and $Q_{S4}$. When MOSFETs $Q_{S1}$ and $Q_{S4}$ are ON (MOSFETs $Q_{S2}$ and $Q_{S3}$ are OFF), current flows in direction A, and motor M rotates in a prescribed direction. Generally, MOSFET $Q_{S4}$ is turned ON and OFF at high frequency to control the speed of rotation of the motor at this time.

When motor M is in a rotating state and MOSFET $Q_{S4}$ turns OFF, regenerative current flows by way of the parasitic diode of MOSFET $Q_{S2}$ and carriers are stored in the parasitic diode. When MOSFET $Q_{S4}$ again turns ON while carriers are stored, MOSFET $Q_{S2}$ enters an ON state during the reverse recovery time of the parasitic diode, causing a time interval during which control of motor M is disabled. Accelerating the response of motor control is made difficult by the long reverse recovery time of the parasitic diode.

FIG. 4 shows an example of a circuit in which the parasitic diode is prevented from operating. In this circuit, Schottky barrier diode 63 is provided to limit the flow of current to parasitic diode 62 that is formed parasitically in MOSFET 61, thereby causing current that flows to parasitic diode 62 to flow to high-speed switching diode 64.

Substituting the MOSFET in the bridge-type motor control circuit shown in FIG. 3 with a circuit configured as described above has the advantage of shortening the reverse recovery time of the parasitic diode and speeding the response of motor control, but also has the drawback that electrical power consumption is increased by the amount of electrical loss of the Schottky barrier diode 63.

As another circuit configuration that illustrates the drawbacks of the semiconductor device of first example of the prior art, FIG. 5 shows a switching regulator that uses synchronous commutation. The switching regulator shown in FIG. 5 is made up of MOSFETs $Q_A$, $Q_B$, $Q_C$, transformer 71, inductor 72, and capacitor 73.

Because transformer 71 and inductor 72 can be reduced in size (enabling smaller switching regulators) in a high-frequency switching regulator, the technology for achieving higher frequency switching regulators has been advancing in recent years.

Because MOSFETs $Q_A$ and $Q_B$ in FIG. 5 are used in place of diodes, the voltage drop occurring at the time of current flow is less than for diodes, thereby affording the advantage of reduced power loss during commutation. However, when the ON/OFF timing for MOSFETs $Q_A$ and $Q_B$ shifts, current flows to parasitic diodes parasitically formed in MOSFETs $Q_A$ and $Q_B$, resulting in switching loss due to the reverse recovery time of the parasitic diodes, and this switching loss increases with higher frequencies. Due to the length of reverse recovery time of the parasitic diodes, switching loss increases with the higher frequency of the switching regulator, thus canceling the advantage of using MOSFETs having small voltage drop in synchronous commutation.

An actual example of a switching regulator using synchronous commutation will next be described to supplement the above explanation, and problems relating to the second example of the prior art will be explained.

FIG. 6 shows the actual circuit configuration of a switching regulator using synchronous commutation. In this switching regulator, transformer 138 is connected such that voltage of opposite phase is supplied to the gates of MOSFETs $Q_A$ and $Q_B$, the gate voltage waveform of MOSFETs $Q_A$ and $Q_B$ therefore being the resonant waveforms shown in FIGS. 7(a) and 7(b), respectively. When MOSFET $Q_A$ turns ON, its gate voltage takes on a rectangular waveform, whereas when MOSFET $Q_B$ turns ON, its gate voltage takes on a resonant waveform, and therefore, there are cases in which MOSFET $Q_B$ does not come completely ON and current flows to parasitic diodes.

When MOSFET $Q_B$ is a MOSFET according to the first example of the prior art, its current waveform is as shown in FIG. 8(a). In this case, the problem arises that when the gate voltage is low, current flows to the parasitic diode, and switching loss occurs due to the reverse recovery characteristics of the parasitic diode.

When a MOSFET according to the second example of the prior art is used as MOSFET $Q_B$, the waveform is as shown in FIG. 8(b). Here, when the gate voltage is low, current flows to the parasitic diode and the Schottky barrier diode.

Because a Schottky barrier diode has a large quantity of carrier elements, there is no storage of a small quantity of carriers as in a parasitic diode, and consequently, there are no reverse recovery characteristics as for a parasitic diode, and switching with a Schottky barrier diode entails virtually no loss. The difference in forward voltage between a Schottky barrier diode and a parasitic diode is small (for example, if the semiconductor substrate is silicon, the forward voltage for a Schottky barrier diode is approximately 0.3–0.4 V, while the forward voltage for a parasitic diode is about 0.6 V), and the diode voltage/current characteristics are exponential, as shown in FIG. 9. Consequently, a certain amount of current flows to parasitic diodes, causing switching loss. Although less current flows to parasitic diodes than for the MOSFET of the first example of the prior art and switching loss is accordingly somewhat lessened, a considerable amount of loss still occurs.

SUMMARY OF THE INVENTION

The present invention was achieved in view of the problems encountered in the prior art and, in constructing a circuit, takes as an object the realization of a semiconductor device in which the occurrence of various problems brought about by parasitic diodes are prevented.

The first configuration of a semiconductor device of the present invention is a semiconductor device provided with first and second insulated-gate field-effect transistors characterized in that:

source regions of the first and second insulated-gate field-effect transistors are electrically connected, the back gate region, which in part constitutes a channel, and the source region of the first insulated-gate field-effect transistor are electrically connected, and the back gate region of the second insulated-gate field-effect transistor is electrically connected with the drain region of the first insulated-gate field-effect transistor.

The second configuration of a semiconductor device of the present invention is a semiconductor device provided with N insulated-gate field-effect transistors, characterized in that:

the source regions of the N insulated-gate field-effect transistors are electrically connected, the back gate region, which in part constitutes a channel, and the source region of the first insulated-gate field-effect transistor of the N insulated-gate field-effect transistors are electrically connected, the back gate region of each of the N insulated-gate field-effect transistors from the second to the (N−1)th insulated-gate field-effect transistor is electrically connected to the drain region of the preceding insulated-gate field-effect transistor, and the back gate region of the Nth insulated-gate field-effect transistor of the N insulated-gate field-effect transistors is electrically connected with the drain region of the (N−1)th insulated-gate field-effect transistor.

The third configuration of a semiconductor device of the present invention is a semiconductor device provided with first and second insulated-gate field-effect transistors and a Schottky barrier diode, characterized in that:

the source regions of the first and second insulated-gate field-effect transistors are electrically connected, the back gate region, which in part constitutes a channel, and the source region of the first insulated-gate field-effect transistor are electrically connected, the back gate region of the second insulated-gate field-effect transistor is electrically connected to the drain region of the first insulated-gate field-effect transistor, and the Schottky barrier diode is electrically parallel connected between the drain region of the second insulated-gate field-effect transistor and each of the source regions.

The fourth configuration of a semiconductor device of the present invention is a semiconductor device provided with N (N≧3) insulated-gate field-effect transistors and a Schottky barrier diode, characterized in that:

the source regions of the N insulated-gate field-effect transistors are electrically connected, the back gate region, which in part constitutes a channel, and the source region of the first insulated-gate field-effect transistor of the N insulated-gate field-effect transistors are electrically connected, the back gate region of each of the N insulated-gate field-effect transistors from the second to the (N−1)th insulated-gate field-effect transistor is electrically connected to the drain region of the preceding insulated-gate field-effect transistor, the back gate region of the Nth insulated-gate field-effect transistor of the N insulated-gate field-effect transistors is electrically connected to the drain region of the (N−1)th insulated-gate field-effect transistor, and the Schottky barrier diode is electrically parallel connected between the drain region of the Nth insulated-gate field-effect transistor and each of the source regions.

In the first and third configurations of the present invention, the second insulated-gate field-effect transistor may comprise a drain region which is an n-type semiconductor substrate, a back gate region which is a p-type impurity diffusion region selectively formed on the surface portion of the semiconductor substrate, a source region which is an n-type impurity diffusion region selectively formed on the surface of the p-type impurity diffusion region, and a gate electrode layer overlying a first insulation film on the surface of the back gate region that is interposed between the source region and the drain region; and the first insulated-gate field-effect transistor may comprise a back gate region which is a p-type semiconductor layer formed overlying the first insulation film on the semiconductor substrate, a source region and drain region which are n-type impurity diffusion layers formed on the semiconductor layer, and a gate electrode that overlies a second insulation film on the surface of the back gate region which is interposed between the source region and drain region.

In the second configuration and fourth configuration of the present invention, the Nth insulated-gate field-effect transistor may comprise a drain region which is an n-type semiconductor substrate, a back gate region which is a p-type impurity diffusion region selectively formed on the surface portion of the semiconductor substrate, a source region which is an n-type impurity diffusion region selectively formed on the surface of the p-type impurity diffusion region, and a gate electrode overlying a first insulation film on the surface of the back gate region which is interposed between the source region and the drain region, and each of the first to (N−1)th insulated-gate field-effect transistors may comprise a back gate region which is a p-type semiconductor layer formed over the first insulation film on the semiconductor substrate, a source region and a drain region which are n-type impurity diffusion layers formed on the semiconductor layer, and a gate electrode overlying a second insulation film on the surface of the back gate region interposed between the source region and the drain region.

The insulated-gate field-effect transistors enter an ON state when the electric potential of the gate with respect to the back gate equals or exceeds a threshold voltage. In a device constructed according to the above-described first configuration of the present invention, when the electric potential of the gate with respect to the source in the first insulated-gate field-effect transistor equals or exceeds the threshold voltage its threshold voltage, the back gate short circuits with the source, thereby triggering an ON state and placing the drain and source at the same electric potential. As a result, the back gate of the second insulated-gate field-effect transistor takes on the same electric potential as the source, and the electric potential of the gate with respect to the source is caused to equal or exceed the threshold voltage of the second insulated-gate field-effect transistor, thereby turning ON the second insulated-gate field-effect transistor.

Accordingly, a semiconductor device constructed according to the first configuration of the present invention turns ON when the electric potential of the gate with respect to the source equals or exceeds the higher threshold voltage of the first and second insulated-gate field-effect transistors, and therefore, ON/OFF control does not differ from MOSFETs of the prior art. In addition, because parasitic diodes occur at each transistor, the pressure resistance of parasitic diodes is high.

In a semiconductor device according to the second configuration of the present invention, the parasitic diode of the Nth insulated-gate field-effect transistor has pressure resistance in the opposite direction with respect to the forward pressure resistance of parasitic diodes of the first to (N−1)th insulated-gate field-effect transistors, and accordingly, by selecting the size of the parasitic diode of the Nth insulated-gate field-effect transistor, operation of parasitic diodes of the entire semiconductor device can be prevented.

In a semiconductor device according to the third configuration of the present invention, because a Schottky barrier diode is connected in parallel between the drain region of the second insulated-gate field-effect transistor and each source region, flow of current to parasitic diodes is reduced.

In a semiconductor device according to the fourth configuration of the present invention, a Schottky barrier diode is connected in parallel between the drain region of the Nth insulated-gate field-effect transistor and the source regions of the first to Nth insulated-gate field-effect transistors, and in addition, either N parasitic diodes are provided in series or two parasitic diodes are provided in reverse series, and consequently, virtually no current flows to parasitic diodes.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Embodiments of the present invention will next be explained with reference to the accompanying figures.

First Embodiment

Figure 10:
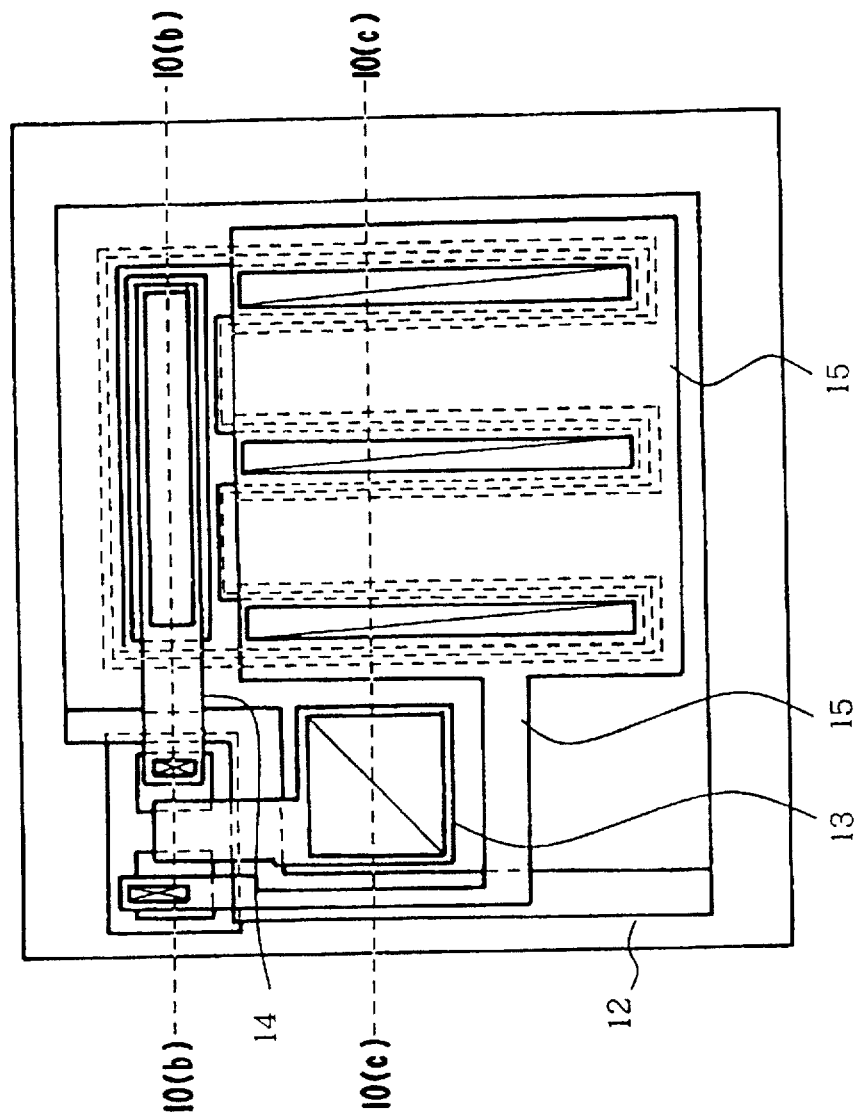
FIG. 10 shows the configuration of the first embodiment of the present invention, FIG. 10(a) being the plan view of a chip, and FIGS. 10(b) and 10(c) being sectional views taken along dotted lines A—A and B—B, respectively, in FIG. 10(a)
Figure 11:
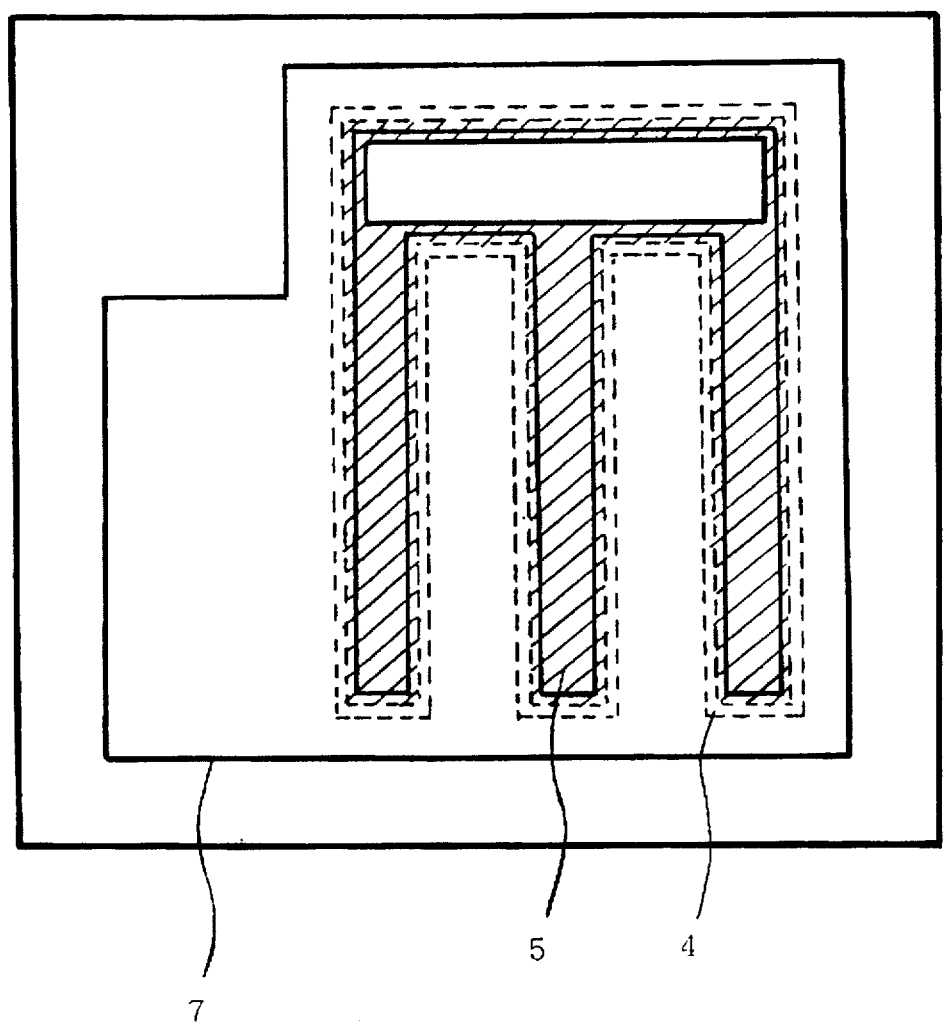
FIG. 11 is a plan view of one portion of FIG. 10(a)
Figure 12:
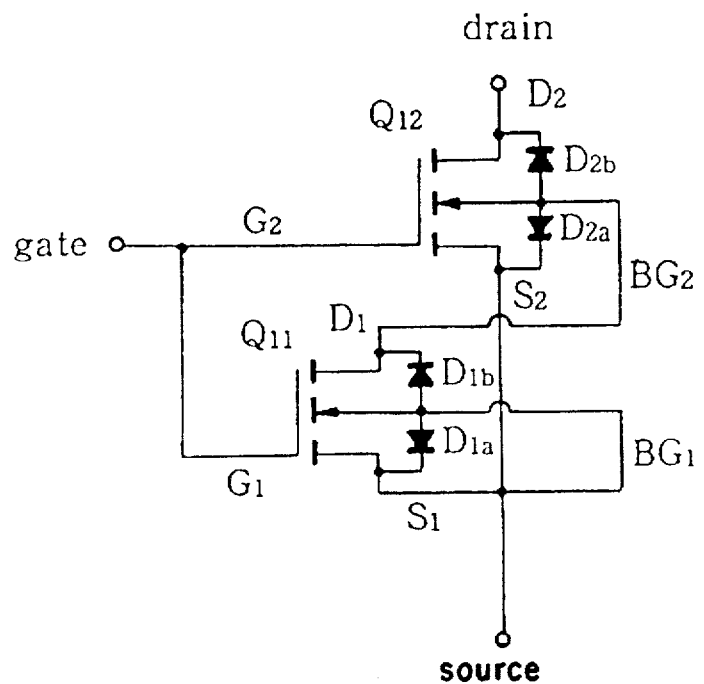
FIG. 12(a) and FIG. 12(b) are equivalent circuit diagrams of the embodiment shown in FIG. 10.
FIG. 12(c) is a circuit diagram showing the configuration of one circuit for preventing operation of parasitic diodes that employs a semiconductor device of the present invention.
Figure 12:
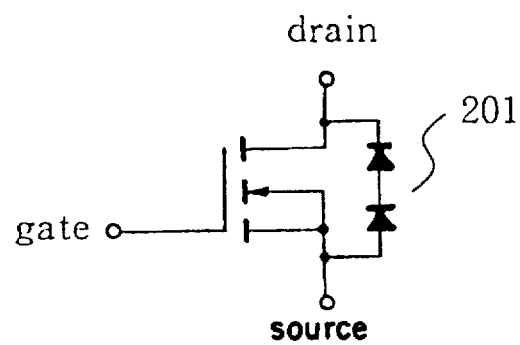
Figure 12:
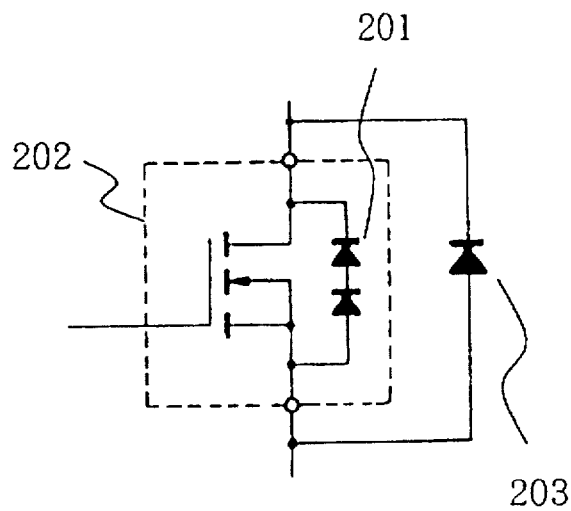

FIG. 10, FIG. 11, and FIG. 12 show the structure of the first embodiment of the semiconductor device according to the present invention. FIG. 10(a) is a plan view of a chip, FIG. 10(b) and FIG. 10(c) are sectional views taken along dotted lines A—A and B—B, respectively, of FIG. 10(a). FIG. 11 is a plan view showing one portion of FIG. 10(a). FIGS. 12(a) and 12(b) are equivalent circuit diagrams of the embodiment shown in FIG. 10, and FIG. 12(c) is a circuit diagram showing the configuration of one example of a circuit for preventing operation of parasitic diodes using the semiconductor device of the present invention.

In FIG. 10, 1 is an $n^+$-type high-density semiconductor substrate, $n^-$-type low-density epitaxial layer 2 being formed on one surface of this high-density semiconductor substrate 1, and the drain region of MOSFET $Q_{12}$ shown in FIG. 12(a) being formed from high-density semiconductor substrate 1 and low-density epitaxial layer 2.

Drain electrode 3 is formed on the surface of the above-described high-density semiconductor substrate 1 opposite the surface on which is formed low-density epitaxial layer 2. In addition, p-type impurity diffusion region 4 is formed as the back gate region of MOSFET $Q_{12}$ within the above-described low-density epitaxial layer 2, and within this impurity diffusion region 4, $n^+$-type impurity diffusion region 5 is formed as the source region of MOSFET $Q_{12}$. Further, gate electrode layer 7 of MOSFET $Q_{12}$ is formed over the above-described low-density epitaxial layer 2 overlying insulation film 6 that extends as far as a portion of the surface of impurity diffusion regions 4, 5. In addition, on insulation film 6 are formed a polycrystalline semiconductor or a single-crystal semiconductor to form p-type impurity diffusion region 8 and $n^+$-type impurity diffusion regions 9, 10. Impurity diffusion regions 8, 9, and 10 are the back gate region, the source region, and the drain region, respectively, of MOSFET $Q_{11}$.

Insulation film 11 is formed extending over a portion of the surfaces of impurity diffusion regions 8, 9, and 10. Interlayer insulation film 12 is formed over gate electrode 7. Next are formed electrode 13 serving as the gate region of MOSFET $Q_{11}$ and electrically connected to the gate region of MOSFET $Q_{12}$, electrode 14 for electrically connecting the drain region of MOSFET $Q_{11}$ and the back gate region of MOSFET $Q_{12}$, and electrode 15 for electrically connecting the source region and back gate region of MOSFET $Q_{11}$ and the source region of MOSFET $Q_{12}$.

$G_1$, $S_1$, $D_1$, and $BG_1$ in FIGS. 10(b) and 10(c) and FIG. 12(a) represent the gate, source, and back gate, respectively, of MOSFET $Q_{11}$; and $G_2$, $S_2$, $D_2$, and $BG_2$ represent the gate, source, drain, and back gate, respectively, of MOSFET $Q_{12}$. $D_{1a}$, $D_{1b}$, $D_{2a}$ and $D_{2b}$ in FIG. 12(a) are parasitic diodes formed in impurity diffusion regions 8 and 9, impurity diffusion regions 8 and 10, impurity diffusion regions 4 and 5, and impurity diffusion regions 4 and 2 in FIG. 10.

The operation of the embodiment configured as described above will next be explained.

A MOSFET turns ON when the electric potential of its gate with respect to the back gate equals or exceeds the threshold voltage. In the equivalent circuit shown in FIG. 12(a), if the electric potential of the gate with respect to the source is equal to or greater than the threshold voltage of MOSFET $Q_{11}$, back gate $BG_1$ short circuits with the source, causing MOSFET $Q_{11}$ to turn ON and drain $D_1$ and source $S_1$ to have equal electric potential. As a result, back gate $BG_2$ has the same electric potential as the source, and if the electric potential of the gate with respect to the source equals or exceeds the threshold voltage of MOSFET $Q_{12}$, MOSFET $Q_{12}$ turns ON. Accordingly, the MOSFET turns ON if the gate electric potential with respect to the source equals or exceeds the higher threshold voltage of MOSFETs $Q_{11}$ and $Q_{12}$, and the ON/OFF control method therefore is the same as for a MOSFET of the prior art. If a positive voltage is impressed to the source with respect to the drain, current flows through parasitic diodes $D_{1b}$ and $D_{2b}$. Accordingly, the equivalent circuit of FIG. 12(a) can be simply represented in an equivalent circuit as a semiconductor circuit having a parasitic diode 201 as shown in FIG. 12(b).

Figure 1:
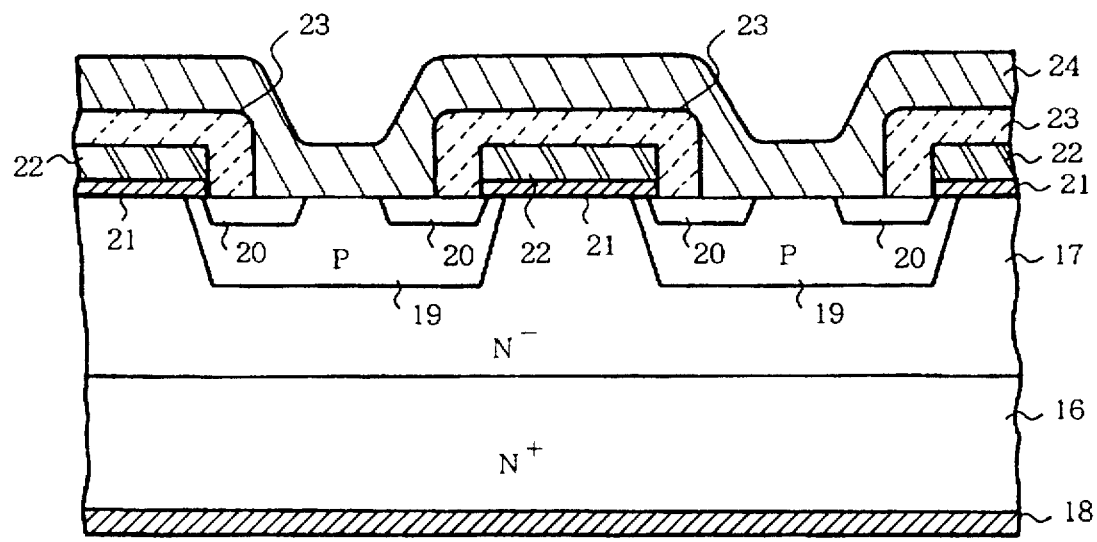
FIG. 1(a) and FIG. 1(b) are a sectional view and an equivalent circuit diagram, respectively, of an insulated-gate field-effect transistor of the prior art.
Figure 1:
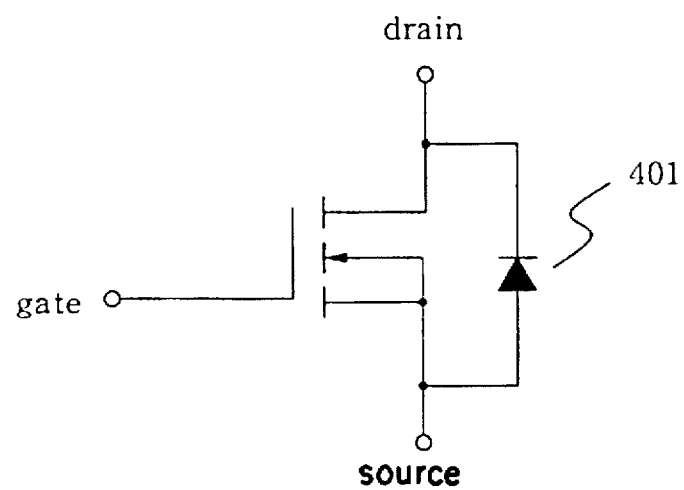
Figure 2:
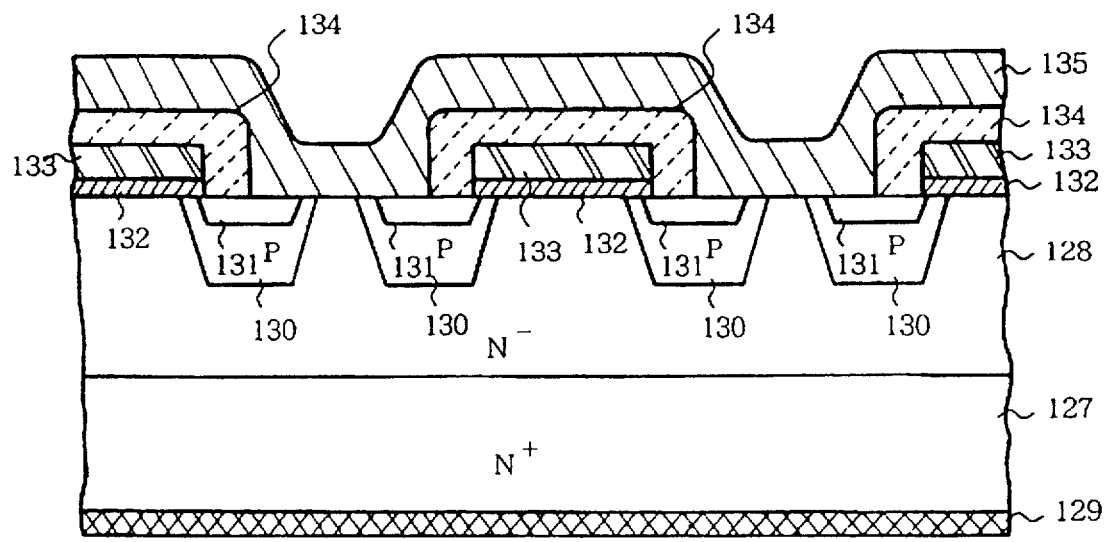
FIG. 2(a) and FIG. 2(b) are a sectional view and an equivalent circuit diagram, respectively, of another insulated-gate field-effect transistor of the prior art.
Figure 2:
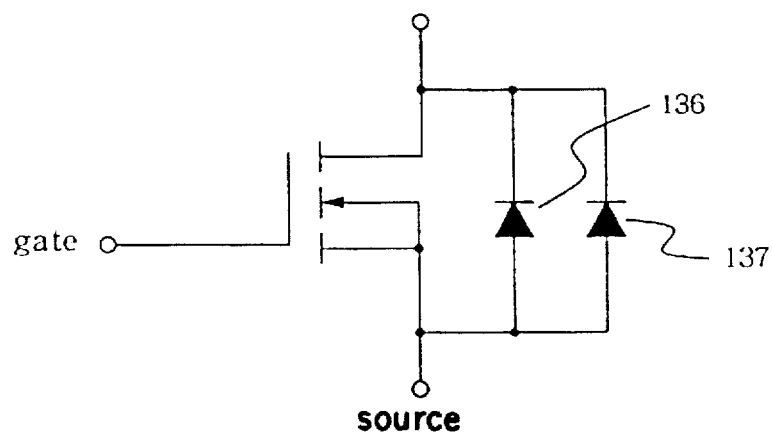
Figure 3:
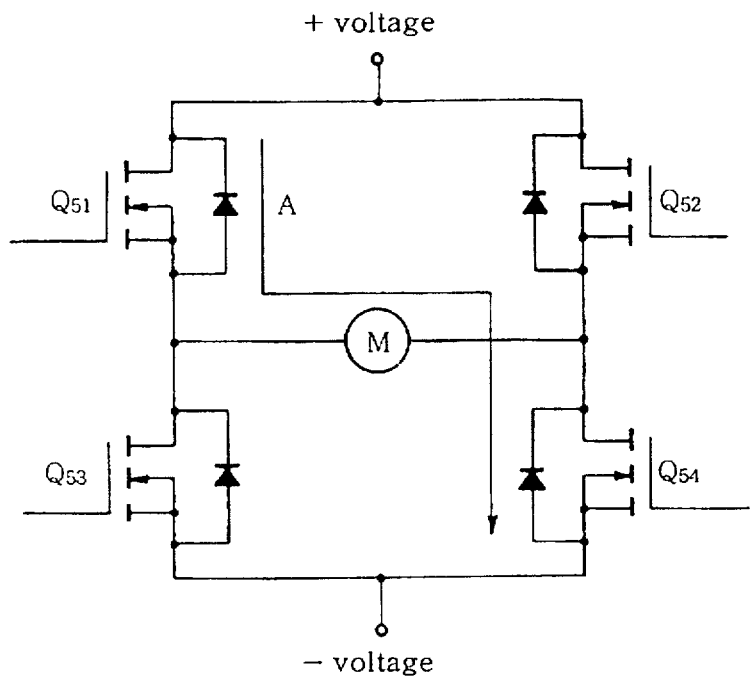
FIG. 3 shows an example of circuit configuration of a bridge-type motor control circuit using a semiconductor device.
Figure 4:
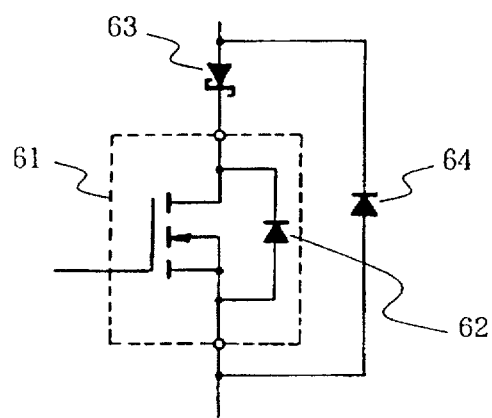
FIG. 4 shows an example of circuit configuration in which parasitic diodes formed in the semiconductor device do not operate.

Regarding a semiconductor device of the present embodiment constructed as described above, FIG. 12(c) shows one example of a circuit for preventing the operation of parasitic diode 201. In the example of a circuit for preventing the operation of parasitic diode 62 shown in FIG. 4, parasitic diode 62 operates if there is no Schottky barrier diode 63 because the forward voltages of parasitic diode 62 and high-speed switching diode 64 are nearly the same. Schottky barrier diode 63 is therefore absolutely essential. However, with the use of the semiconductor device of the present embodiment, the forward voltage of parasitic diode 201 is approximately 1.2 V, which is about twice as high as the approximately 0.6 V of high-speed switching diode 203, and consequently, current does not flow to parasitic diode 201 even in the absence of a Schottky barrier diode, and the operation of parasitic diode 201 in semiconductor device 202 can be prevented using only the circuit configuration shown in FIG. 12(c). As a result, this configuration has the advantage of reducing circuit power consumption by the amount of power loss caused by a Schottky barrier diode.

Second Embodiment

Figure 13:
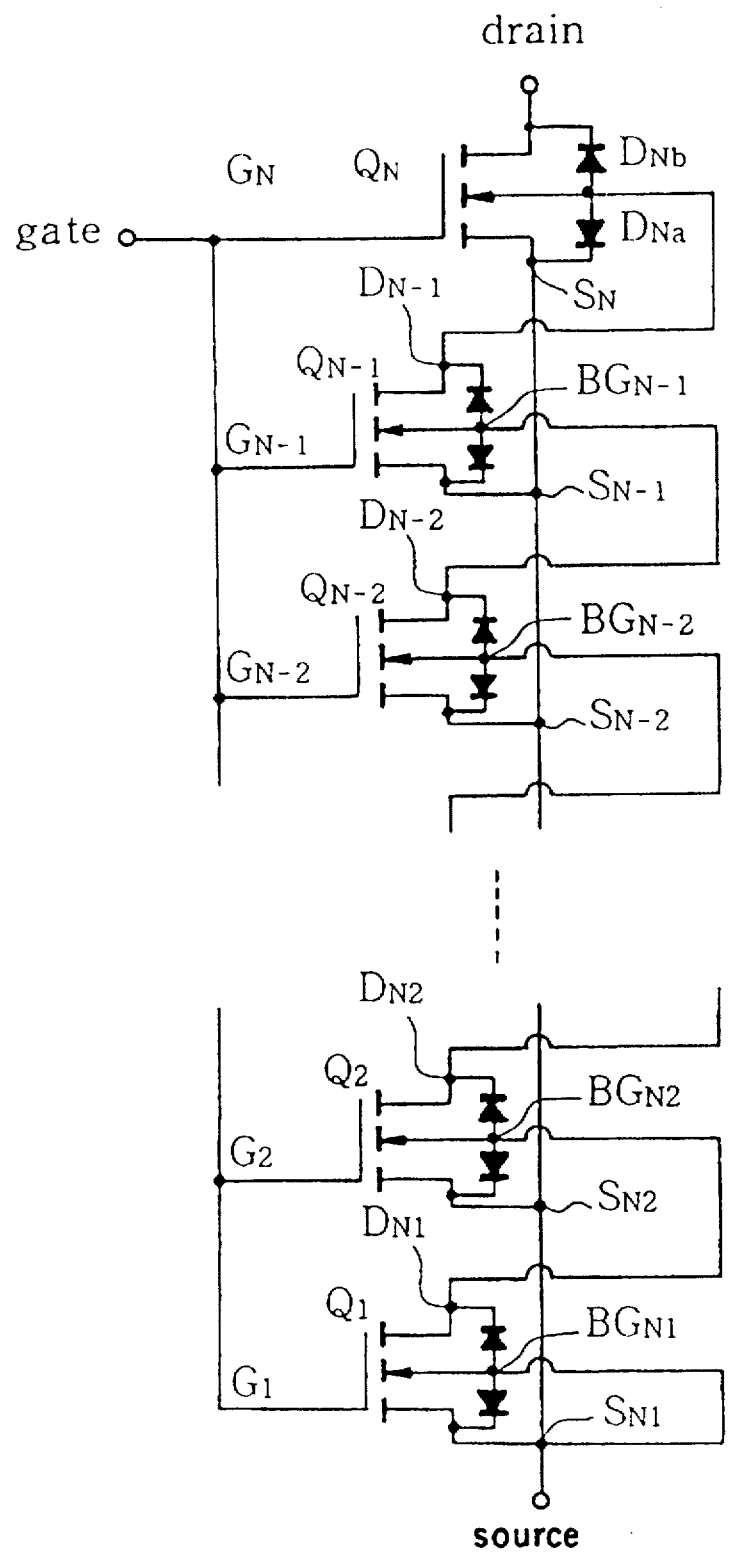
FIG. 13(a) to FIG. 13(c) are each equivalent circuit diagrams of the second embodiment of the semiconductor device of the present invention.
Figure 13:
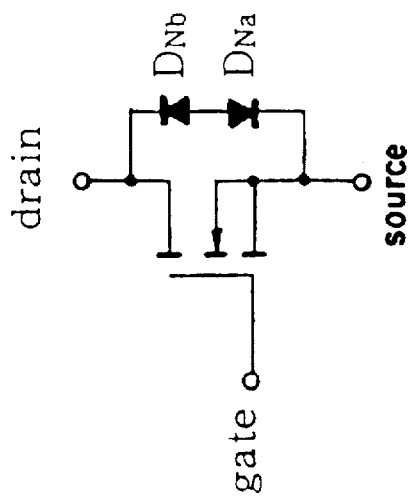
Figure 13:
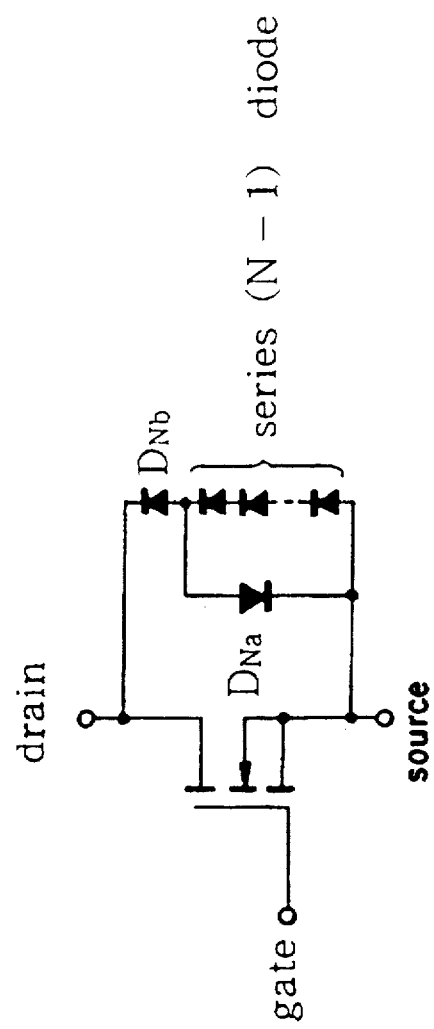

FIG. 13 is an equivalent circuit diagram of a semiconductor device according to the second embodiment of the present invention. MOSFETs $Q_1$ to $Q_{N-1}$ shown in FIG. 13(a) are formed in the same way as MOSFET $Q_{11}$ of the first embodiment shown in FIG. 10, MOSFET $Q_N$ is formed in the same way as MOSFET $Q_{12}$ shown in FIG. 10, and only the wiring has been changed as shown in the equivalent circuit shown in FIG. 13(a), and accordingly, plan views and sectional views are here omitted.

FIG. 13(b) is an equivalent circuit diagram that is a further simplification of the equivalent circuit of FIG. 13(a). In the semiconductor device according to this embodiment, the number of MOSFETs N is determined such that the forward pressure resistance of the N−1 parasitic diodes connected in series of MOSFETs $Q_1$ to $Q_{N-1}$ is greater than the breakdown pressure resistance of parasitic diode $D_{Na}$ of MOSFET $Q_N$. When structured in this way, the equivalent circuit shown in FIG. 13(b) can be further abbreviated as shown in FIG. 13(c).

By merely causing MOSFETs $Q_1$ to $Q_{N-1}$ operate such that the back gate and source of MOSFET $Q_N$ are made the same electric potential, current does not flow, thereby allowing a great reduction in the size of MOSFET $Q_1$ to MOSFET $Q_{N-1}$.

Figure 5:
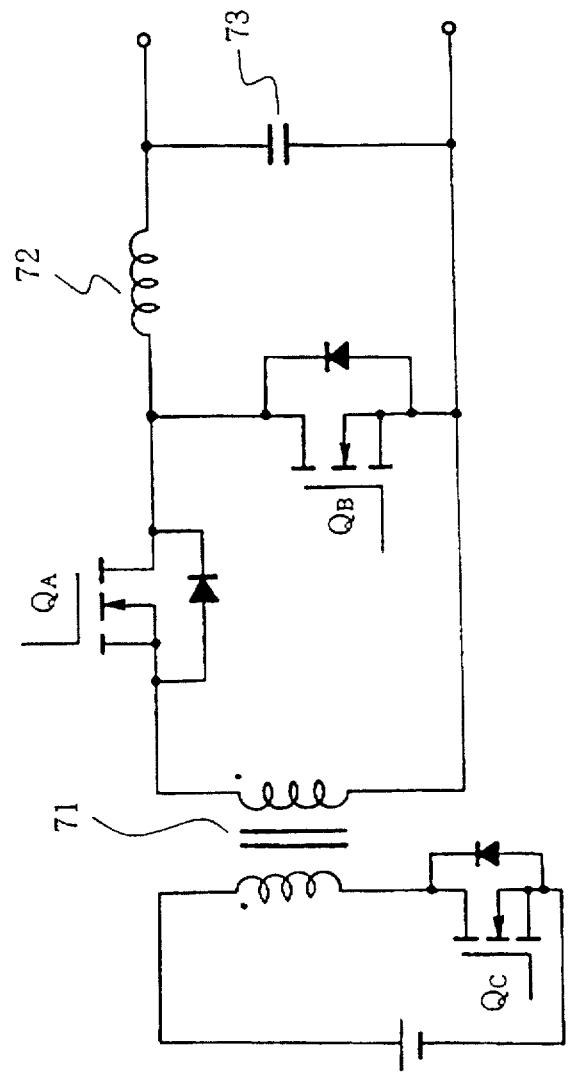
FIG. 5 shows the circuit configuration of a switching regulator that operates by synchronous commutation using a semiconductor device.
Figure 6:
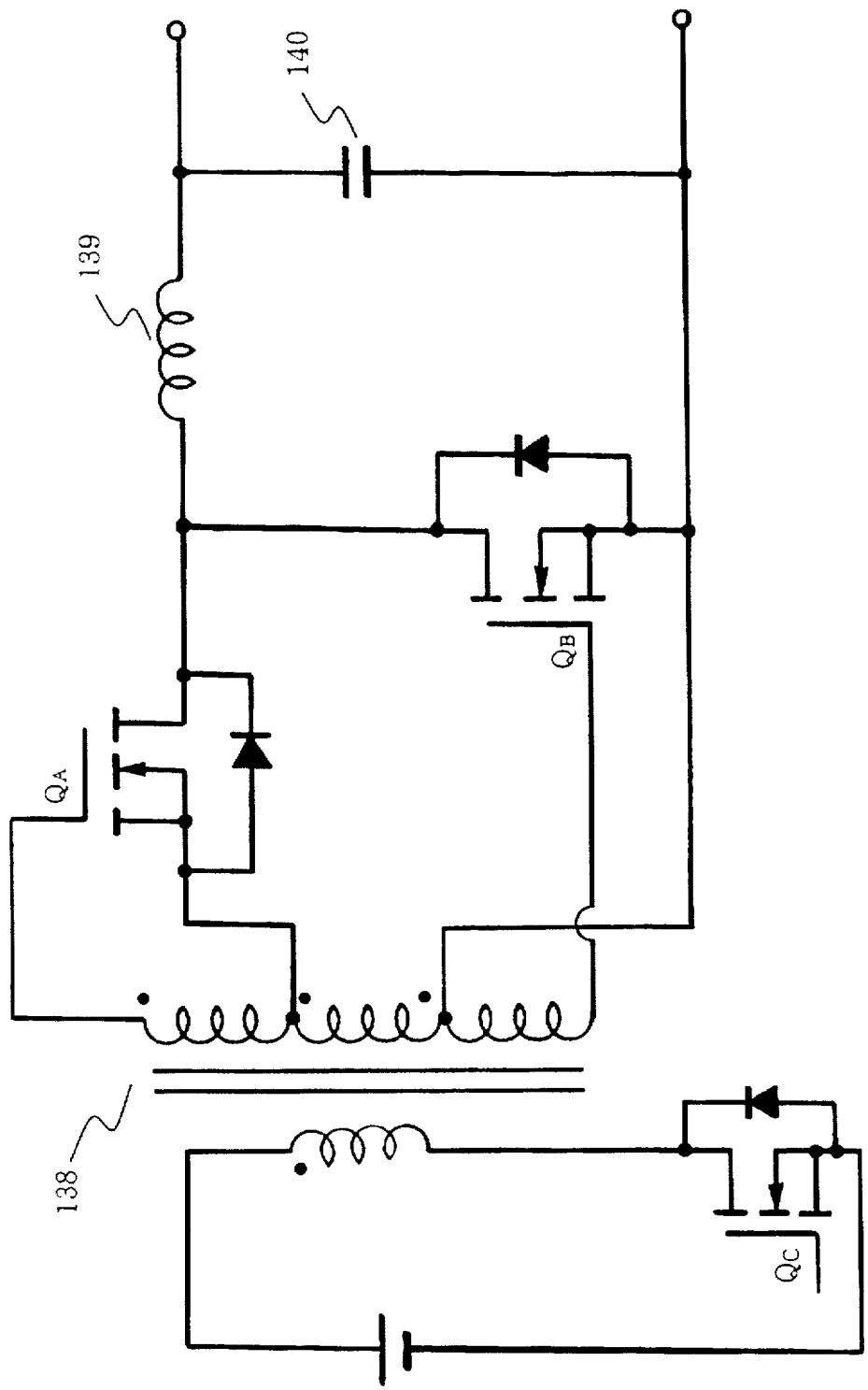
FIG. 6 shows the circuit configuration of an example of a switching regulator that operates by synchronous commutation using a semiconductor device.
Figure 7:
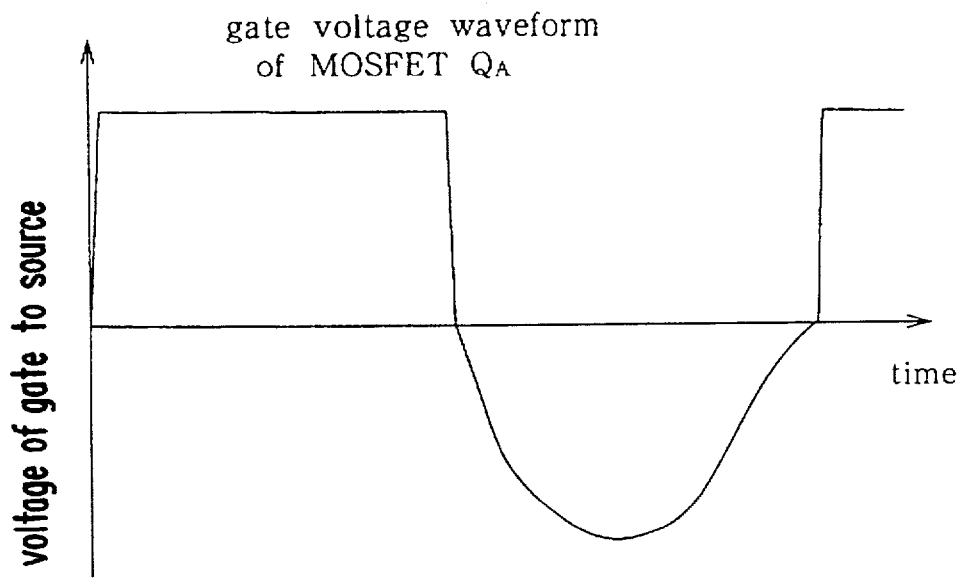
FIG. 7(a) and 7(b) show the gate voltage waveform of MOSFETs $Q_A$ and $Q_B$, respectively, in FIG. 6.
Figure 7:
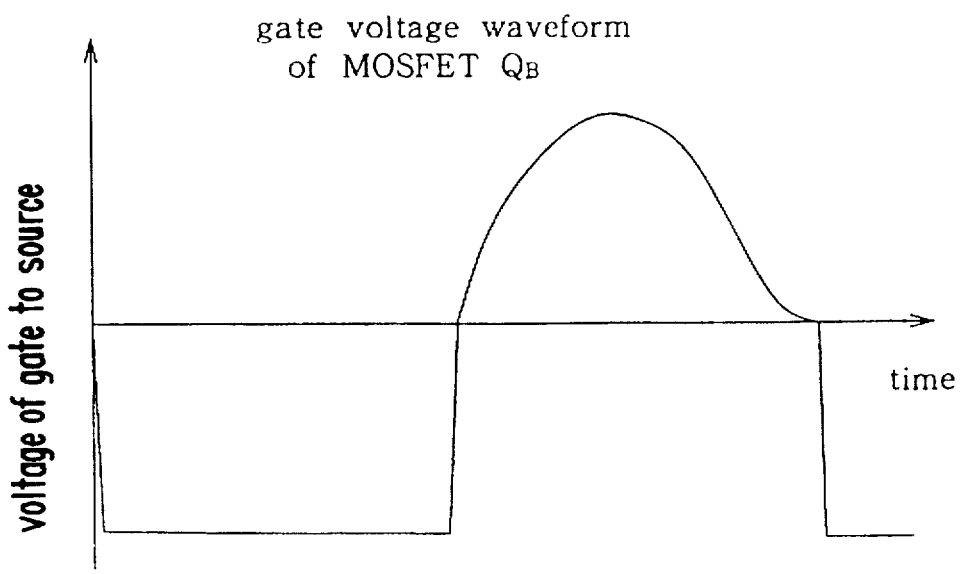
Figure 8:
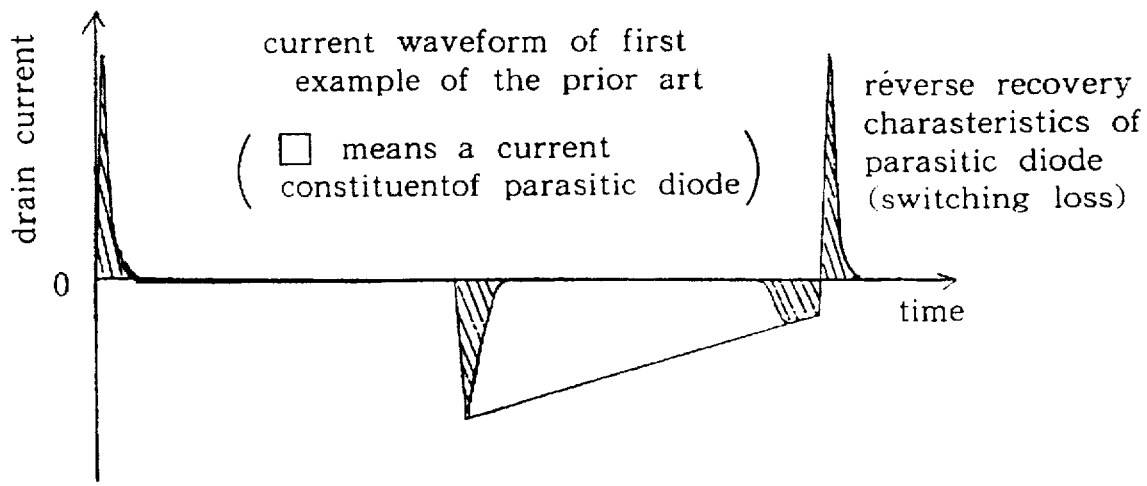
FIG. 8(a) and 8(b) show the current waveform of MOSFET $Q_B$ in FIG. 6, respectively.
Figure 8:
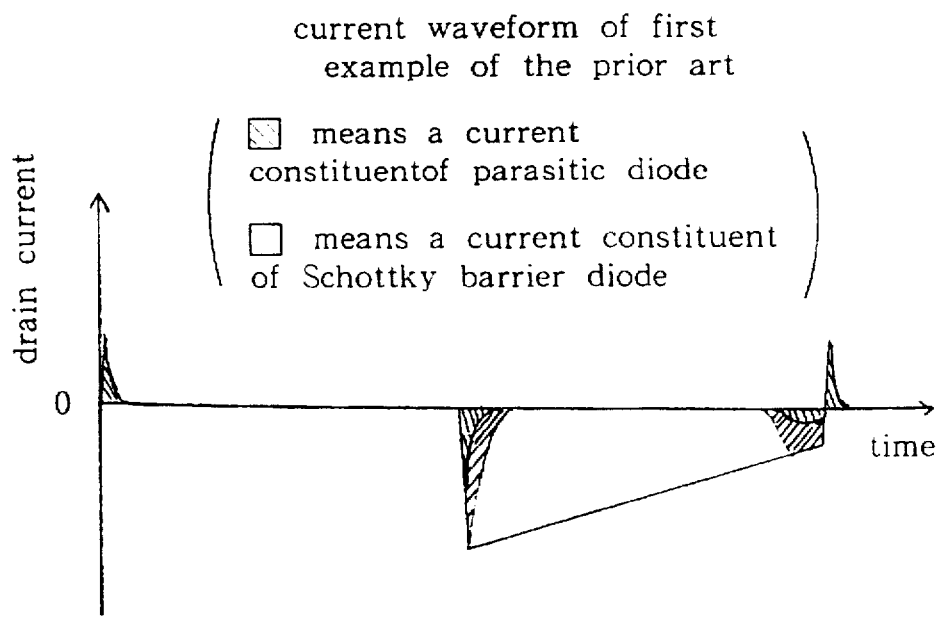
Figure 9:
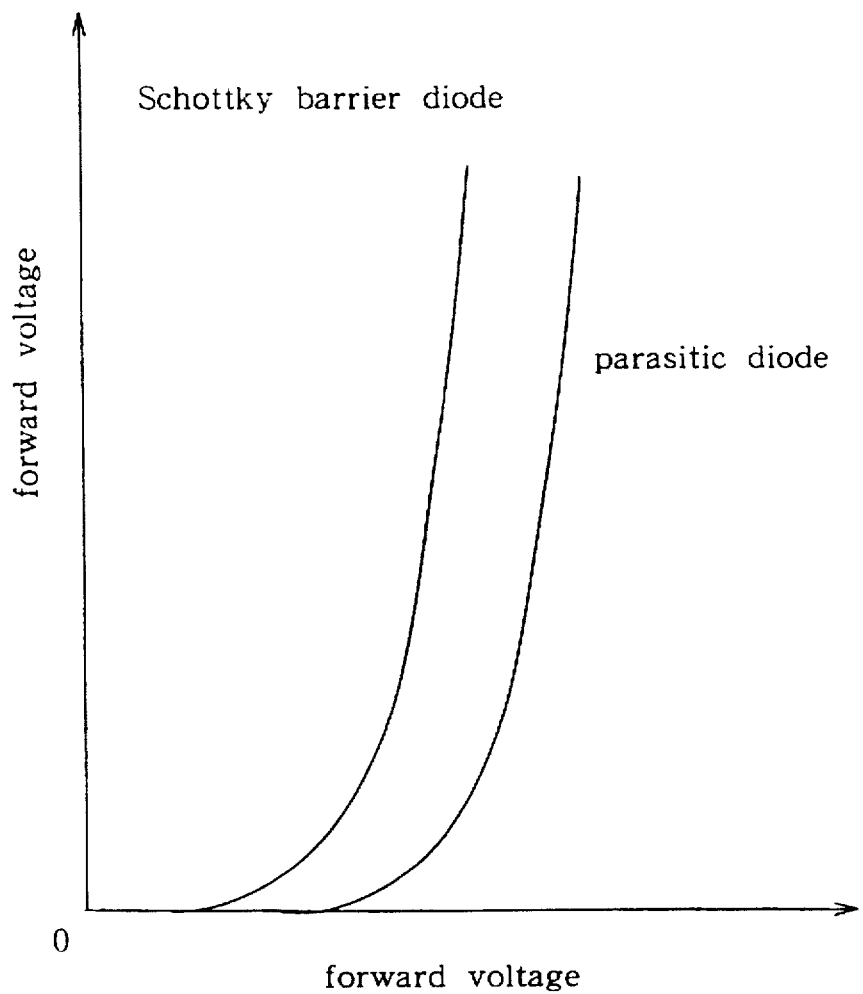
FIG. 9 shows the voltage and current characteristics of a diode.

If a semiconductor device of the present embodiment configured as described above is employed in the switching regulator circuit shown in FIG. 5, switching loss due to parasitic diodes is eliminated, and full advantage may be taken of a MOSFET having a small voltage drop.

Third Embodiment

Figure 14:
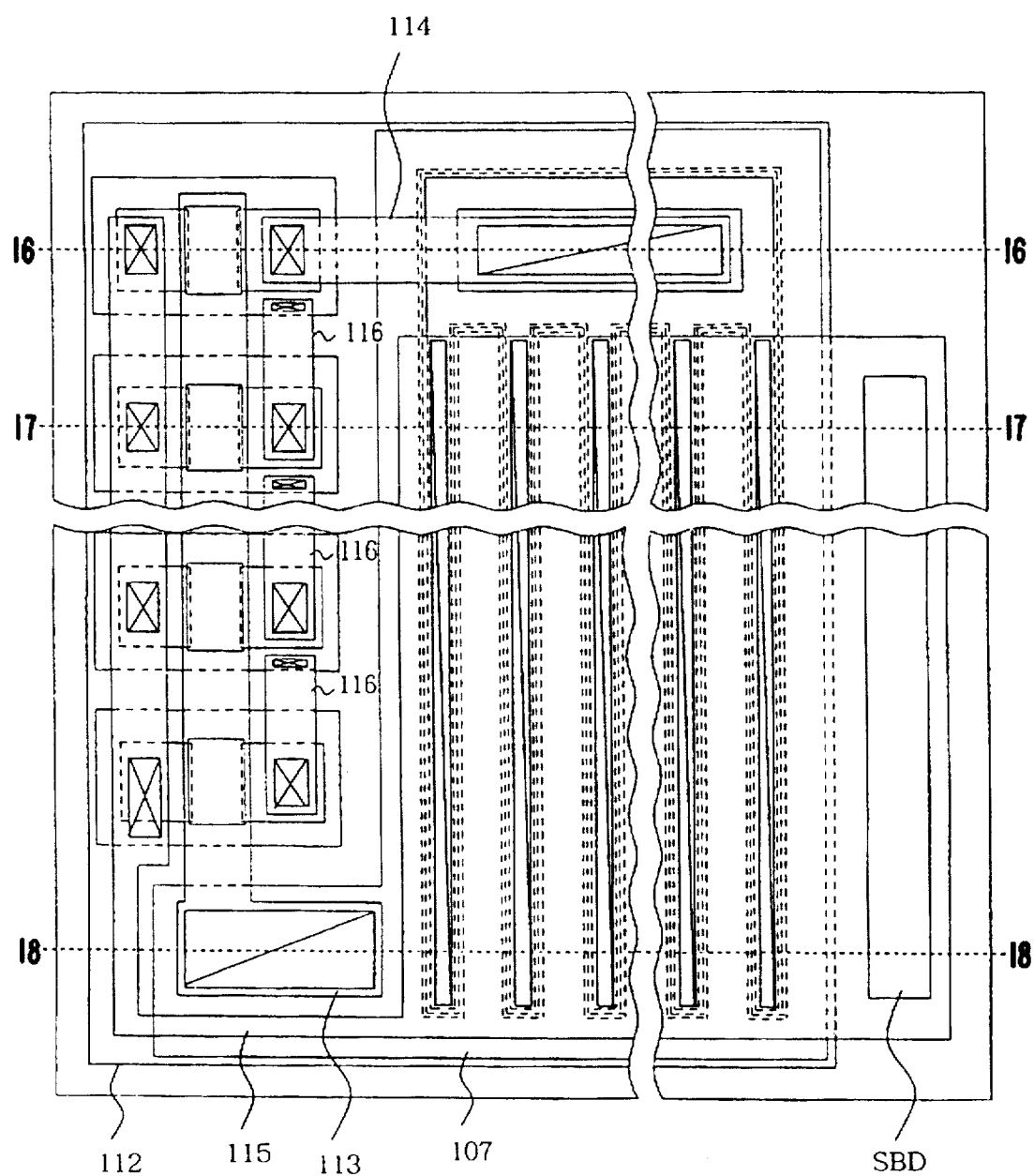
FIG. 14 is a plan view of a chip of a semiconductor device according to the third embodiment of the present invention.
Figure 15:
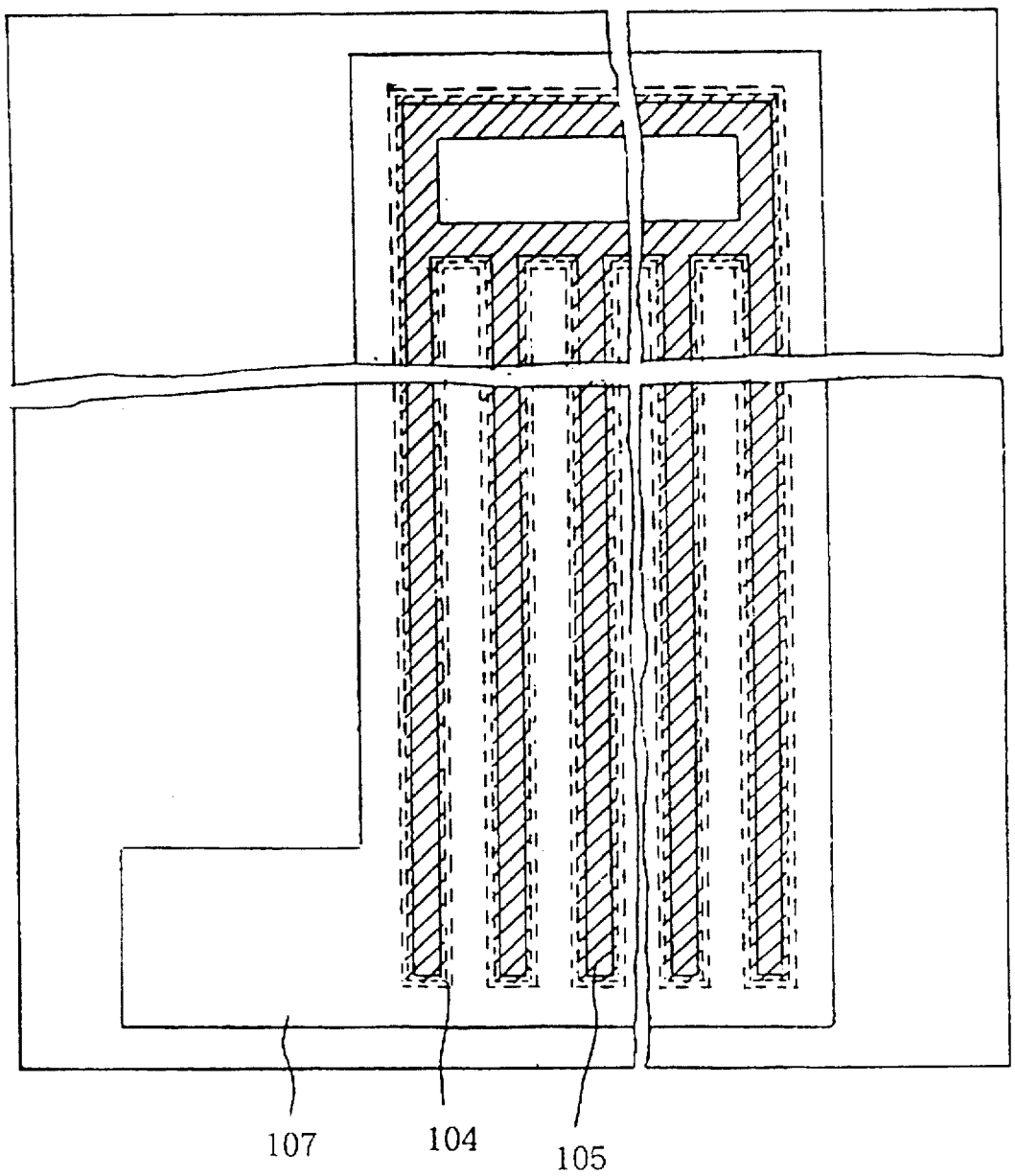
FIG. 15 is plan view showing one portion of FIG. 14.
Figure 16:
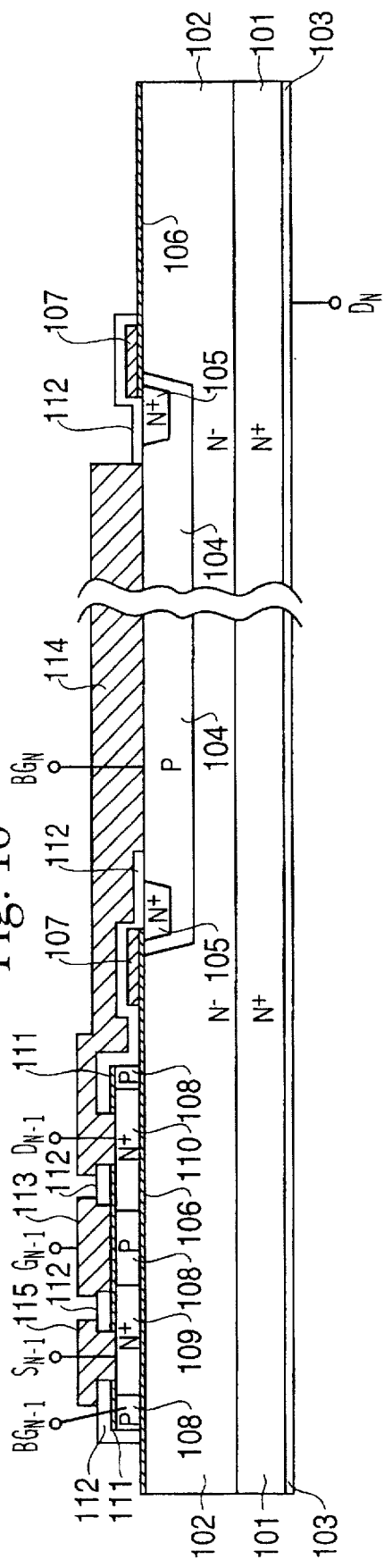
FIG. 16 is a sectional view taken along dotted line A—A of FIG. 14.
Figure 17:
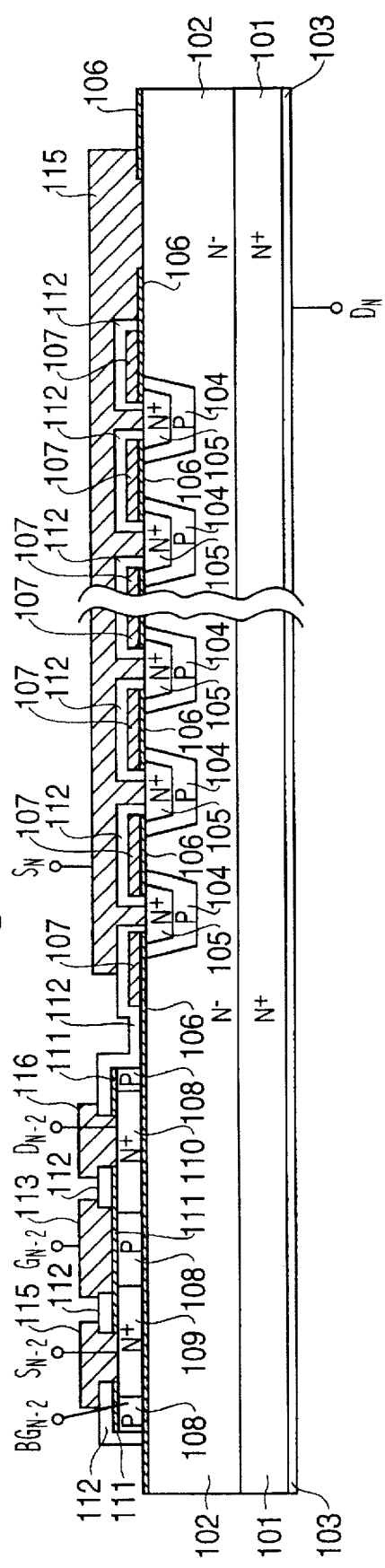
FIG. 17 is sectional view taken along dotted line B—B of FIG. 14.
Figure 18:
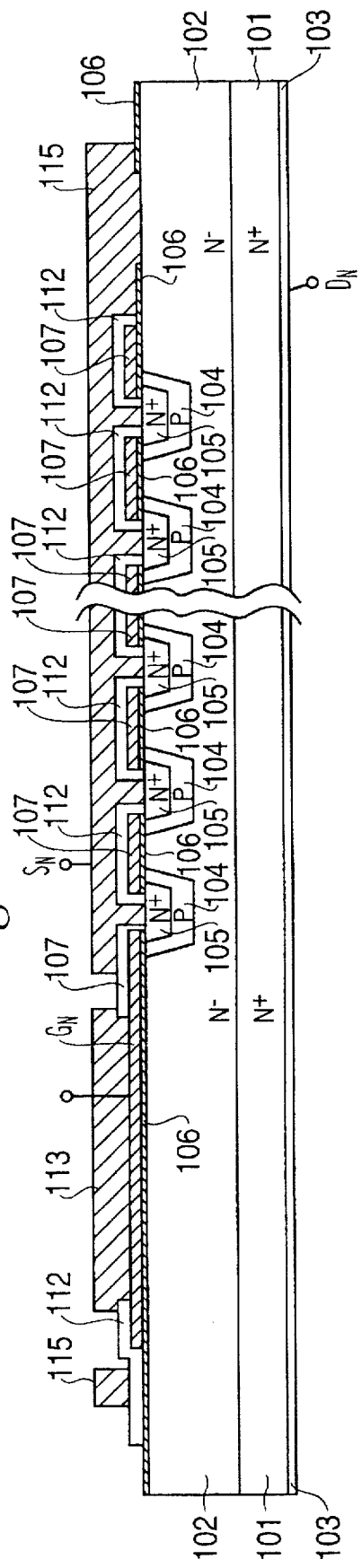
FIG. 18 is a sectional view taken along dotted line C—C of FIG. 14.
Figure 19:
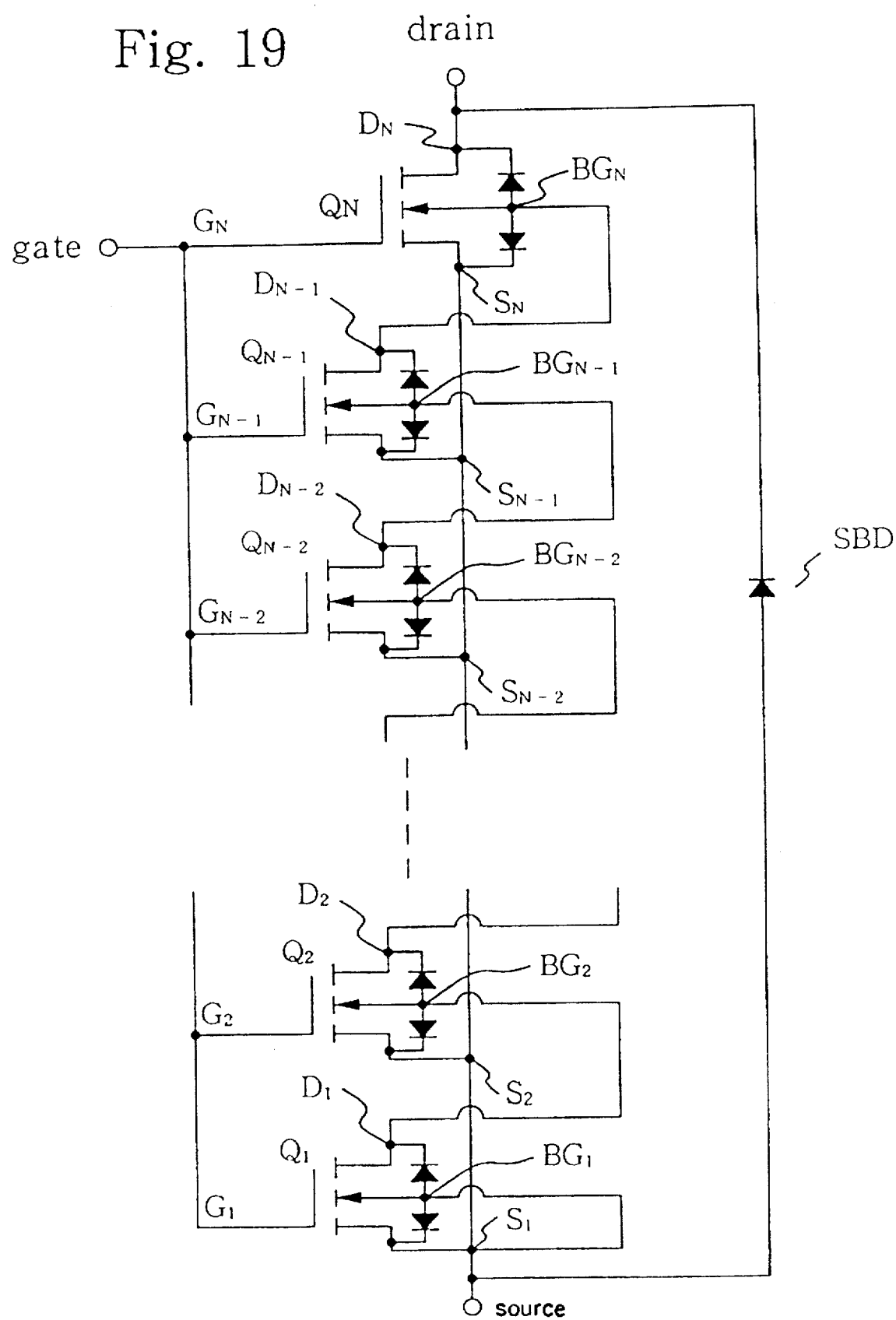
FIG. 19 is an equivalent circuit diagram of the embodiment shown in FIG. 14.

The third embodiment of the present invention will next be explained with reference to the figures. FIGS. 14 to 19 are each for the purpose of illustrating the third embodiment of a semiconductor device according to the present invention. FIG. 14 is a plan view of a chip; FIG. 15 is a plan view showing one portion of FIG. 14; FIGS. 16, 17, and 18 each show sectional views taken along dotted lines A—A, B—B, and C—C, respectively, of FIG. 14; and FIG. 19 is an equivalent circuit diagram of the embodiment shown in FIG. 14.

In each figure, 101 is an n$^+$-type high-density semiconductor substrate, an n$^-$-type low-density epitaxial layer 102 being formed on the surface of this high-density semiconductor substrate 101, and the drain region $D_N$ of MOSFET $Q_N$ shown in FIG. 19 being formed by high-density semiconductor substrate 101 and low-density epitaxial layer 102.

Drain electrode 103 is formed on the surface of the above-described high-density semiconductor substrate 101 opposite the surface on which is formed low-density epitaxial layer 102. In addition, p-type impurity diffusion region 104 is formed as the back gate region of MOSFET $Q_N$ within the above-described low-density epitaxial layer 102, and within this impurity diffusion region 104, n$^+$-type impurity diffusion region 105 is formed as the source region of MOSFET $Q_N$. Further, gate electrode layer 107 of MOSFET $Q_N$ is formed over the above-described low-density epitaxial layer 102 overlying insulation film 106 that extends as far as a portion of the surface of impurity diffusion regions 104, 105. In addition, on insulation film 106 are formed a polycrystalline semiconductor or a single-crystal semiconductor to form p-type impurity diffusion region 108 and n$^+$-type impurity diffusion regions 109, 110. Impurity diffusion regions 108, 109, and 110 are the back gate region, the source region, and the drain region, respectively, of MOSFET $Q_1$ to MOSFET $Q_{N-1}$. Insulation film 111 is formed extending over a portion of the surfaces of impurity diffusion regions 108, 109, and 110. Interlayer insulation film 112 is formed over gate electrode 107. Electrode 113 is next formed that electrically connects with the gate region of MOSFET $Q_N$ and that serves as the gate region of MOSFET $Q_1$ to MOSFET $Q_{N-1}$. For each MOSFET from the second to the (N-1)th MOSFET, electrode 116 is formed that electrically connects the back gate region to the drain region of the preceding MOSFET. In addition, electrode 114 is formed that electrically connects the back gate region of MOSFET $Q_N$ to the drain region of MOSFET $Q_{N-1}$. Finally, aluminum electrode 115 is formed that electrically connects the source regions of MOSFET $Q_1$ to MOSFET $Q_N$ with the back gate region of MOSFET $Q_1$, and moreover, that is the Schottky junction with low-density epitaxial layer 102.

In FIGS. 16 to 19, $G_1$–$G_N$, $S_1$–$S_N$, $D_1$–$D_N$, and $BG_1$–$BG_N$ indicate the gate, source, drain, and back gate of MOSFETs $Q_1$ to $Q_N$, respectively.

In FIG. 19, the diodes connected to back gate terminals $BG_1$–$BG_N$ are parasitic diodes formed from impurity diffusion regions 104 and 105, impurity diffusion regions 108 and 109, impurity diffusion regions 108 and 110, and impurity diffusion region 104 and low-density epitaxial layer 102. The Schottky barrier diode SBD in FIG. 19 is formed from aluminum electrode 115 and low-density epitaxial layer 102.

The operation of the embodiment configured as described above will next be explained. A MOSFET turns ON when the electric potential of the gate with respect to the back gate equals or exceeds a threshold voltage. In the equivalent circuit of FIG. 19, when the electric potential of the gate with respect to the source is made equal to or greater than the threshold voltage of MOSFET $Q_1$ back gate terminal $BG_1$ short circuits with the source, whereby MOSFET $Q_1$ turns ON and drain $D_1$ and the source have the same electric potential. As a result, back gate terminal $BG_2$ takes on the same electric potential as the source. If the gate potential with respect to the source is equal to or greater than the threshold voltage of MOSFET $Q_2$, MOSFET $Q_2$ turns ON.

Accordingly, if the gate potential with respect to the source exceeds the threshold voltage of each of MOSFET $Q_1$ to MOSFET $Q_N$, MOSFET $Q_1$ to MOSFET $Q_N$ turn ON in order.

In the semiconductor device of this embodiment, the highest threshold voltage among MOSFET $Q_1$ to MOSFET $Q_N$ becomes the threshold voltage.

Figure 20:
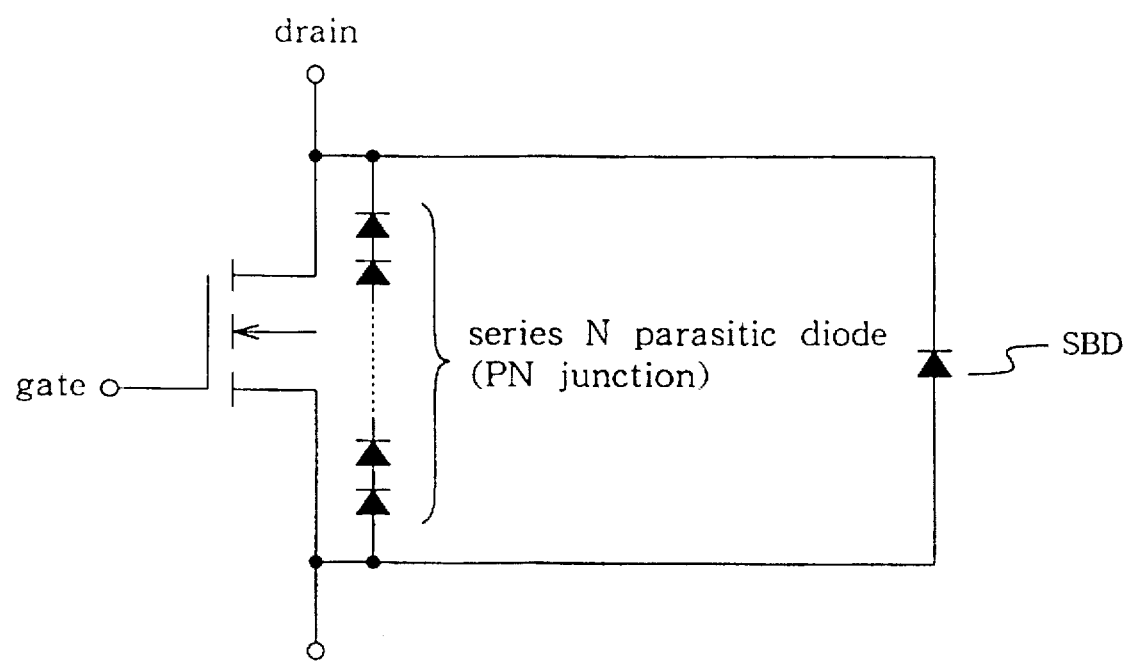
FIG. 20 is a simplified equivalent circuit diagram of the embodiment shown in FIG. 14.

When a positive voltage is impressed to the source with respect to the drain, there are current paths that flow through the Schottky barrier diode and through the parasitic diodes. However, because the N parasitic diodes are connected in series, current does not flow through the parasitic diodes unless a voltage of N times the forward voltage $V_F$ of the parasitic diodes is impressed. The simplified equivalent circuit shown in FIG. 20 illustrates this point.

If N is set to increase the differential voltage between (forward voltage $V_F$ of the parasitic diodes)×N and (forward voltage $V_F$ of Schottky barrier diode), nearly all of the current flows to the Schottky barrier diode, and nearly none flows to the parasitic diodes.

As a result, using the semiconductor device of the present invention as a commutation element affords the advantage of severely limiting switching loss and commutation loss, resulting in a reduction of approximately 70% in switching loss and approximately 20% in commutation loss compared to a MOSFET of the prior art.

Fourth Embodiment

In the above-described third embodiment, aluminum electrode 115 serves as both the source electrode of MOSFET $Q_N$ and the barrier metal of the Schottky barrier diode in order to reduce manufacturing steps, but in the fourth embodiment, a barrier metal such as Ti, Pt, or W is formed on the contact portion of low-density epitaxial layer 102, which portion forms the Schottky barrier diode, before aluminum electrode 115 is formed.

If a metal such as Ti having a lower barrier than an aluminum electrode is formed before forming aluminum electrode 115, the forward voltage $V_F$ of the Schottky barrier diode is lower than in the third embodiment, thereby affording a still lower commutation loss.

With the above-described construction, the present invention exhibits the following effects:

When the forward pressure resistance of parasitic diodes is increased and high-speed switching diodes are attached from the outside, current flows only to the outside diodes. Because current is more easily controlled in cheaper exterior components, manufacturing costs can be reduced when constructing, for example a motor control circuit, and power consumption can be reduced.

In addition, because the operation of parasitic diodes can be prevented, the various problems arising from parasitic diodes can be solved. In particular, full advantage may be taken of the low voltage effect of insulated-gate field-effect transistors when constructing a switching regulator circuit.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor device provided with first and second insulated-gate field-effect transistors characterized in that:
    source regions of said first and second insulated-gate field-effect transistors are electrically connected, a back gate region and a source region of said first insulated-gate field-effect transistor are electrically connected, and a back gate region of said second insulated-gate field-effect transistor is electrically connected with a drain region of said first insulated-gate field-effect transistor, wherein the drain region of said first insulated-gate field-effect transistor is electrically isolated from a drain region of said second insulated-gate field-effect transistor.

2. A semiconductor device provided with N insulated-gate field-effect transistors, characterized in that:

source regions of said N insulated-gate field effect transistors are electrically connected, a back gate region and a source region of said first of said N insulated-gate field-effect transistors are electrically connected, a back gate region of each of said N insulated-gate field-effect transistors from the second until the (N−1)th insulated-gate field-effect transistor is electrically connected to a drain region of the preceding insulated-gate field-effect transistor, a back gate region of the Nth of said N insulated-gate field-effect transistors is electrically connected with a drain region of the (N−1)th insulated-gate field-effect transistor, and the number of N is determined such that the forward pressure resistance of N−1 parasitic diodes of the first until the (N−1)th insulated-gate field-effect transistor is greater than the breakdown pressure resistance of a parasitic diode of the Nth insulated-gate field-effect transistor, wherein drain regions of said N insulated-gate field-effect transistors are electrically isolated from one another.

3. A semiconductor device according to claim 1 wherein said second insulated-gate field-effect transistor comprises a drain region which is an n-type semiconductor substrate, a back gate region which is a p-type impurity diffusion region selectively formed on the surface portion of said semiconductor substrate, a source region which is an n-type impurity diffusion region selectively formed on the surface of said p-type impurity diffusion region, and a gate electrode layer overlying a first insulation film on the surface of said back gate region that is interposed between said source region and said drain region; and said first insulated-gate field-effect transistor comprises a back gate region which is a p-type semiconductor layer formed overlying said first insulation film on said semiconductor substrate, a source region and drain region which are n-type impurity diffusion layers formed on said first insulation film, and a gate electrode that overlies a second insulation film on the surface of a back gate region which is interposed between said source region and drain region.

4. A semiconductor device according to claim 2 wherein the Nth insulated-gate field-effect transistor comprises a drain region which is an n-type semiconductor substrate, a back gate region which is a p-type impurity diffusion region selectively formed on the surface portion of said semiconductor substrate, a source region which is an n-type impurity diffusion region selectively formed on the surface of said p-type impurity diffusion region, and a gate electrode overlying a first insulation film on the surface of the back gate region which is interposed between said source region and said drain region, and each of the first to (N−1)th insulated-gate field-effect transistors comprises a back gate region which is a p-type semiconductor layer formed over said first insulation film on said semiconductor substrate, a source region and a drain region which are n-type impurity diffusion layers formed on said semiconductor layer, and a gate electrode overlying a second insulation film on the surface of said back gate region interposed between said source region and drain region.

5. A semiconductor device comprising:

a first insulated-gate field-effect transistor, a second insulated-gate field-effect transistor, each of said transistors having a source region, a drain region and a back gate region, a first electrical connection for connecting said source regions of said first and second transistors, a second electrical connection for connecting said back gate region and said source region of said first transistor, and a third electrical connection for connecting said back gate region of said second transistor to said drain region of said first transistor, wherein said drain region of said first transistor is electrically isolated from a drain region of said second transistor.

6. A semiconductor device according to claim 5 wherein said second insulated-gate field-effect transistor comprises a drain region which is an n-type semiconductor substrate, a back gate region which is a p-type impurity diffusion region selectively formed on the surface portion of said semiconductor substrate, a source region which is an n-type impurity diffusion region selectively formed on the surface of said p-type impurity diffusion region, and a gate electrode layer overlying a first insulation film on the surface of said back gate region that is interposed between said source region and said drain region; and said first insulated-gate field-effect transistor comprises a back gate region which is a p-type semiconductor layer formed overlying said first insulation film on said semiconductor substrate, a source region and drain region which are n-type impurity diffusion layers formed on said first insulation film, and a gate electrode that overlies a second insulation film on the surface of a back gate region which is interposed between said source region and drain region.

7. A semiconductor device comprising:

N insulated-gate field-effect transistors, each of said transistors having a source region, a drain region and a back gate region, a first electrical connection for connecting said source regions of said transistors, a second electrical connection for connecting said back gate region and said source region of a first transistor of said N transistors, a third electrical connection for connecting said back gate region of each of said N transistors from the second to the (N−1)th transistor to said drain region of a preceding one of said transistors, and a fourth electrical connection for connecting said back gate region of an Nth transistor of said N transistors with said drain region of said (N−1)th transistor, wherein drain regions of said N transistors are electrically isolated from one another.

8. A semiconductor device according to claim 7 wherein
said Nth insulated-gate field-effect transistor comprises a drain region which is an n-type semiconductor substrate, a back gate region which is a p-type impurity diffusion region selectively formed on the surface portion of said semiconductor substrate, a source region which is an n-type impurity diffusion region selectively formed on the surface of said p-type impurity diffusion region, and a gate electrode overlying a first insulation film on the surface of the back gate region which is interposed between said source region and said drain region, and each of said first to (N−1)th insulated-gate field-effect transistors comprises a back gate region which is a p-type semiconductor layer formed over said first insulation film on said semiconductor substrate, a source region and a drain region which are n-type impurity diffusion layers formed on said first insulation film, and a gate electrode overlying a second insulation film on the surface of said back gate region interposed between said source region and drain region.

9. A semiconductor device according to claim 1, wherein the back gate region of said second insulated-gate field-effect transistor is electrically isolated from the source regions of said first and second insulated-gate field-effect transistors.

10. A semiconductor device according to claim 2, wherein the back gate region of each of said second through Nth insulated-gate field-effect transistor is electrically isolated from the source regions of said N insulated-gate field effect transistors.

11. A semiconductor device according to claim 5, wherein the back gate region of said second transistor is electrically isolated from the source regions of said first and second transistors.

12. A semiconductor device according to claim 7, wherein the back gate region of each of said second through Nth transistor is electrically isolated from the source regions of said N transistors.

* * * * *